United States Patent
Satoh et al.

(10) Patent No.: US 8,715,414 B2
(45) Date of Patent: May 6, 2014

(54) PROCESS FOR PRODUCING $SI_{(1-v-w-x)}C_wAL_xN_v$ BASE MATERIAL, PROCESS FOR PRODUCING EPITAXIAL WAFER, $SI_{(1-v-w-x)}C_wAL_xN_v$ BASE MATERIAL, AND EPITAXIAL WAFER

(75) Inventors: Issei Satoh, Itami (JP); Michimasa Miyanaga, Osaka (JP); Shinsuke Fujiwara, Itami (JP); Hideaki Nakahata, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 836 days.

(21) Appl. No.: 12/989,036

(22) PCT Filed: Apr. 17, 2009

(86) PCT No.: PCT/JP2009/057722
§ 371 (c)(1),
(2), (4) Date: Oct. 21, 2010

(87) PCT Pub. No.: WO2009/131063
PCT Pub. Date: Oct. 29, 2009

(65) Prior Publication Data
US 2011/0031534 A1  Feb. 10, 2011

(30) Foreign Application Priority Data

Apr. 24, 2008 (JP) ................................. 2008-114466
Mar. 10, 2009 (JP) ................................. 2009-056914

(51) Int. Cl.
*C30B 29/38* (2006.01)
(52) U.S. Cl.
USPC .............. 117/90; 117/101; 117/104; 117/105
(58) Field of Classification Search
CPC ..................................................... C30B 29/38
USPC ......................... 117/84, 86, 90, 101, 104, 105
See application file for complete search history.

(56) References Cited

U.S. PATENT DOCUMENTS 4,382,837 A   5/1983 Rutz
4,983,538 A   1/1991 Gotou
(Continued)

FOREIGN PATENT DOCUMENTS

JP   61-291495   12/1986
JP   4-167477    6/1992
(Continued)

OTHER PUBLICATIONS

I. Jenkins et al., "Growth of solid solutions of aluminum nitride and silicon carbide by metalorganic chemical vapor deposition," Journal of Crystal Growth, 1993, pp. 375-378, vol. 128.

(Continued)

*Primary Examiner* — Bob M Kunemund
(74) *Attorney, Agent, or Firm* — Drinker Biddle & Reath LLP

(57) ABSTRACT

There are provided a $Si_{(1-v-w-x)}C_wAl_xN_v$ substrate that achieves high crystallinity and low costs, an epitaxial wafer, and manufacturing methods thereof.
A method for manufacturing a $Si_{(1-v-w-x)}C_wAl_xN_v$ substrate according to the present invention includes the steps of preparing a different type of substrate 11 and growing a $Si_{(1-v-w-x)}C_wAl_xN_v$ layer having a main surface on the different type of substrate 11. The component ratio x+v at the main surface of the $Si_{(1-v-w-x)}C_wAl_xN_v$ layer is 0<x+v<1. The component ratio x+v increases or decreases monotonically from the interface between the $Si_{(1-v-w-x)}C_wAl_xN_v$ layer and the different type of substrate 11 to the main surface of the $Si_{(1-v-w-x)}C_wAl_xN_v$ layer. The component ratio x+v at the interface between the $Si_{(1-v-w-x)}C_wAl_xN_v$ layer and the different type of substrate 11 is closer to that of the material of the different type of substrate 11 than the component ratio x+v at the main surface of the $Si_{(1-v-w-x)}C_wAl_xN_v$ layer.

9 Claims, 5 Drawing Sheets

(56) References Cited

U.S. PATENT DOCUMENTS

| | | | |
|---|---|---|---|
| 6,086,672 | A | 7/2000 | Hunter |
| 2003/0056719 | A1 | 3/2003 | Kouvetakis et al. |
| 2006/0236923 | A1* | 10/2006 | Kouvetakis et al. ......... 117/108 |
| 2007/0249066 | A1* | 10/2007 | Li et al. ............................ 438/3 |
| 2008/0258133 | A1 | 10/2008 | Seong |
| 2008/0277778 | A1 | 11/2008 | Furman et al. |
| 2009/0101928 | A1 | 4/2009 | Kim et al. |
| 2010/0221897 | A1* | 9/2010 | Seong .......................... 438/481 |
| 2011/0039071 | A1 | 2/2011 | Satoh et al. |
| 2011/0042788 | A1 | 2/2011 | Satoh et al. |
| 2012/0280212 | A1* | 11/2012 | Strittmatter et al. ............ 257/28 |

FOREIGN PATENT DOCUMENTS

| | | |
|---|---|---|
| JP | 2005-506695 | 3/2005 |
| WO | WO 03/033781 | 4/2003 |
| WO | WO 2008/008407 A1 | 1/2008 |

OTHER PUBLICATIONS

R.S. Kern et al, "Growth of pseudomorphic heterostructures and solid solutions in the AlN-SiC system by plasma-assisted, gas-source molecular beam epitaxy," Institute of Physics Conference Series, 1993, pp. 389-392, No. 137, Chapter 4.

J. H. Edgar et al., "Interface properties of an AlN/(AlN)$_x$(SiC)$_{1-x}$/4H—SiC heterostructure," Physica Status Solidi (a), 2006, pp. 3720-3725, vol. 203, No. 15.

Z. Gu et al., "Sublimation growth of aluminum nitride on silicon carbide substrate with aluminum nitride-silicon carbide alloy transition layer," Journal of Materials Research, Mar. 2007, pp. 675-680, vol. 22, No. 3.

U.S. Office Action dated Oct. 26, 2011 that issued in U.S. Appl. No. 12/989,039 including Double Patenting Rejections on pp. 7-9.

U.S. Office Action dated Feb. 23, 2012 that issued in U.S. Appl. No. 12/989,039 including Double Patenting Rejections on pp. 5-8.

Final Office Action dated Sep. 26, 2013 that issued in U.S. Appl. No. 13/715,254.

U.S. Office Action dated Apr. 1, 2013 that issued in U.S. Appl. No. 13/715,254 including Double Patenting Rejections on pp. 4-6.

Ostrikov, K., et al. "Self-Assembled Low-Dimensional Nanomaterials via Low-Temperature Plasma Processing," Thin Solid Films, vol. 516, No. 19, Nov. 19, 2007, pp. 6609-6615.

U.S. Office Action dated Mar. 4, 2013 that issued in U.S. Appl. No. 12/989,015 including Double Patenting Rejections on pp. 5-7.

S. Huang et al., "Synthesis and Property Study of Nanoparticle Quaternary Semiconductor SiCAlN Films with Co-sputtering Under Lower Temperature", Surf. Rev. Lett., 2005, vol. 12, No. 3, pp. 397-400.

J. Tolle et al., "Growth of SiCAlN on Si(111) via a crystalline oxide interface", Appl. Phys. Lett., Sep. 16, 2002, vol. 81, No. 12, pp. 2181-2183.

R. Roucka et al., "Low-temperature growth of SiCAlN films of high hardness on Si(111) substrates", Appl. Phys. Lett., Oct. 29, 2001, vol. 79, No. 18, pp. 2880-2882.

J.S. Pelt et al., "Characterization of crystalline SiC films grown by pulsed laser deposition", Thin Solid Films, vol. 371, pp. 72-79, 2000.

A. Avramescu et al., "Growth of AlN-SiC solid solutions by sequential supply epitaxy", Journal of Crystal Growth, vol. 234, pp. 435-439, 2002.

J.H. Edgar et al., "Metalorganic chemical vapor deposition of (AlN)$_x$(SiC)$_{1-x}$ alloy films", Inst. Phys. Conf. Ser., No. 137, Chapter 4, pp. 401-404, 1993.

* cited by examiner

PROCESS FOR PRODUCING SI$_{(1-v-w-x)}$C$_w$AL$_x$N$_v$ BASE MATERIAL, PROCESS FOR PRODUCING EPITAXIAL WAFER, SI$_{(1-v-w-x)}$C$_w$AL$_x$N$_v$ BASE MATERIAL, AND EPITAXIAL WAFER

TECHNICAL FIELD

Background Art

The present invention relates to a method for manufacturing a Si$_{(1-v-w-x)}$C$_w$Al$_x$N$_v$ substrate, a method for manufacturing an epitaxial wafer, a Si$_{(1-v-w-x)}$C$_w$Al$_x$N$_v$ substrate, and an epitaxial wafer.

Al$_{(1-y-z)}$Ga$_y$In$_z$N ($0 \le y \le 1$, $0 \le z \le 1$, and $0 \le y+z \le 1$) crystals, such as aluminum nitride (AlN) crystals, having an energy bandgap of 6.2 eV, a thermal conductivity of approximately 3.3 WK$^{-1}$ cm$^{-1}$, and high electrical resistance have been used as materials for semiconductor devices, such as short-wavelength optical devices and power electronic devices. Conventionally, such crystals have been grown on a base substrate, for example, by a vapor phase epitaxy method.

Si$_{(1-v-w-x)}$C$_w$Al$_x$N$_v$ substrates have received attention as base substrates on which such materials are grown. For example, U.S. Pat. No. 4,382,837 (Patent Literature 1), U.S. Pat. No. 6,086,672 (Patent Literature 2), and Japanese Unexamined Patent Application Publication (Translation of PCT Application) No. 2005-506695 (Patent Literature 3) describe a method for manufacturing a Si$_{(1-v-w-x)}$C$_w$Al$_x$N$_v$ substrate.

Patent Literature 1 discloses that a raw material is heated at a temperature in the range of 1900° C. to 2020° C. for sublimation, thereby growing (SiC)$_{(1-x)}$(AlN)$_x$ crystals on Al$_2$O$_3$ (sapphire). Patent Literature 2 discloses that a raw material is heated at a temperature in the range of 1810° C. to 2492° C. to grow (SiC)$_{(1-x)}$(AlN)$_x$ crystals on silicon carbide (SiC) at a temperature in the range of 1700° C. to 2488° C. Patent Literature 3 discloses that (SiC)$_{(1-x)}$(AlN)$_x$ crystals are grown on silicon (Si) at a raw material gas temperature in the range of 550° C. to 750° C. by a molecular-beam epitaxy (MBE) method.

PTL 1: U.S. Pat. No. 4,382,837
PTL 2: U.S. Pat. No. 6,086,672
PTL 3: Japanese Unexamined Patent Application Publication (Translation of PCT Application) No. 2005-506695

SUMMARY OF INVENTION

Technical Problem

In Patent Literatures 1 to 3, however, (SiC)$_{(1-x)}$(AlN)$_x$ crystals are grown on a different type of substrate. The different type of substrate and the (SiC)$_{(1-x)}$(AlN)$_x$ crystals have different compositions and therefore have different lattice constants and thermal expansion coefficients. Thus, the problem is that the (SiC)$_{(1-x)}$(AlN)$_x$ crystals have low crystallinity.

The differences in lattice constant and thermal expansion coefficient between a SiC substrate in Patent Literature 2 and (SiC)$_{(1-x)}$(AlN)$_x$ crystals are smaller than the corresponding differences between a sapphire substrate or a Si substrate and the (SiC)$_{(1-x)}$(AlN)$_x$ crystals. However, SiC substrates are more expensive than sapphire substrates and Si substrates. Thus, the problem is that the SiC substrate requires higher costs to manufacture (SiC)$_{(1-x)}$(AlN)$_x$ crystals.

In view of the problems described above, it is an object of the present invention to provide a method for manufacturing a Si$_{(1-v-w-x)}$C$_w$Al$_x$N$_v$ substrate that achieves high crystallinity and low costs, a method for manufacturing an epitaxial wafer, a Si$_{(1-v-w-x)}$C$_w$Al$_x$N$_v$ substrate, and an epitaxial wafer.

Solution to Problem

A method for manufacturing a Si$_{(1-v-w-x)}$C$_w$Al$_x$N$_v$ substrate according to the present invention includes the following steps. First, a different type of substrate is prepared. A Si$_{(1-v-w-x)}$C$_w$Al$_x$N$_v$ layer having a main surface ($0 \le v \le 1$, $0 \le w \le 1$, $0 \le x \le 1$, and $0 \le v+w+x \le 1$) is grown on the different type of substrate. The component ratio x+v at the main surface of the Si$_{(1-v-w-x)}$C$_w$Al$_x$N$_v$ layer is $0 < x+v < 1$. The component ratio x+v increases or decreases monotonically from the interface between the Si$_{(1-v-w-x)}$C$_w$Al$_x$N$_v$ layer and the different type of substrate to the main surface of the Si$_{(1-v-w-x)}$C$_w$Al$_x$N$_v$ layer. The component ratio x+v at the interface between the Si$_{(1-v-w-x)}$C$_w$Al$_x$N$_v$ layer and the different type of substrate is closer to that of the material of the different type of substrate than the component ratio x+v at the main surface of the Si$_{(1-v-w-x)}$C$_w$Al$_x$N$_v$ layer.

In accordance with a method for manufacturing a Si$_{(1-v-w-x)}$C$_w$Al$_x$N$_v$ substrate according to the present invention, between a Si$_{(1-v-w-x)}$C$_w$Al$_x$N$_v$ layer at the main surface and a different type of substrate are grown Si$_{(1-v-w-x)}$C$_w$Al$_x$N$_v$ crystals having a component ratio x+v between them. The difference in lattice constant and the difference in thermal expansion coefficient between Si$_{(1-v-w-x)}$C$_w$Al$_x$N$_v$ crystals having a component ratio x+v between them and a different type of substrate and the difference in lattice constant and the difference in thermal expansion coefficient between the Si$_{(1-v-w-x)}$C$_w$Al$_x$N$_v$ crystals having a component ratio x+v between them and Si$_{(1-v-w-x)}$C$_w$Al$_x$N$_v$ crystals at the main surface are smaller than the difference in lattice constant and the difference in thermal expansion coefficient between the Si$_{(1-v-w-x)}$C$_w$Al$_x$N$_v$ layer at the main surface and the different type of substrate. This can reduce the lattice mismatch and the difference in thermal expansion coefficient between the Si$_{(1-v-w-x)}$C$_w$Al$_x$N$_v$ layer at the main surface and the different type of substrate. This can improve the crystallinity of Si$_{(1-v-w-x)}$C$_w$Al$_x$N$_v$ crystals having the component ratio x+v at the main surface, that is, a component ratio x+v to be manufactured, of the Si$_{(1-v-w-x)}$C$_w$Al$_x$N$_v$ layer.

The crystallinity of Si$_{(1-v-w-x)}$C$_w$Al$_x$N$_v$ crystals having the component ratio x+v at the main surface of the Si$_{(1-v-w-x)}$C$_w$Al$_x$N$_v$ layer can be improved without increasing the thickness of Si$_{(1-v-w-x)}$C$_w$Al$_x$N$_v$ crystals having a component ratio x+v between them. This obviates the need to manufacture Si$_{(1-v-w-x)}$C$_w$Al$_x$N$_v$ crystals having a component ratio x+v between them as the base substrate. This can reduce the costs, required to manufacture Si$_{(1-v-w-x)}$C$_w$Al$_x$N$_v$ crystals to be manufactured.

Thus, the crystallinity of Si$_{(1-v-w-x)}$C$_w$Al$_x$N$_v$ crystals having a component ratio x+v to be manufactured on a certain base substrate can be improved. Furthermore, the manufacturing costs of a Si$_{(1-v-w-x)}$C$_w$Al$_x$N$_v$ substrate containing Si$_{(1-v-w-x)}$C$_w$Al$_x$N$_v$ crystals having desired crystallinity can be reduced. Thus, a Si$_{(1-v-w-x)}$C$_w$Al$_x$N$_v$ substrate that achieves both high crystallinity and low costs can be manufactured.

Preferably, the method for manufacturing a Si$_{(1-v-w-x)}$C$_w$Al$_x$N$_v$ substrate described above further includes the step of removing the different type of substrate after the growing step.

This allows a Si$_{(1-v-w-x)}$C$_w$Al$_x$N$_v$ layer that does not include a different type of substrate and that achieves both high crystallinity and low costs to be manufactured.

Preferably, in a method for manufacturing a $Si_{(1-v-w-x)}C_wAl_xN_v$ substrate, a $Si_{(1-v-w-x)}C_wAl_xN_v$ layer having a plurality of sublayers is grown.

In the plurality of sublayers, the component ratio x+v increases or decreases sequentially from the component ratio x+v of a sublayer close to a different type of substrate to the component ratio x+v of a sublayer at the main surface. The raw materials for the sublayers can be changed to grow the $Si_{(1-v-w-x)}C_wAl_xN_v$ layer having a plurality of sublayers. Thus, a $Si_{(1-v-w-x)}C_wAl_xN_v$ layer that achieves both high crystallinity and low costs can be easily manufactured.

In the growing step in the method for manufacturing a $Si_{(1-v-w-x)}C_wAl_xN_v$ substrate described above, preferably, the $Si_{(1-v-w-x)}C_wAl_xN_v$ layer is grown by a pulsed laser deposition (PLD) method.

A raw material for the $Si_{(1-v-w-x)}C_wAl_xN_v$ layer can be irradiated with a laser beam to generate plasma. The plasma can be supplied to the surface of the different type of substrate. Thus, the $Si_{(1-v-w-x)}C_wAl_xN_v$ layer can be grown in a non-equilibrium state. Unlike the equilibrium state, this growth condition is not a stable state. Si can therefore bond to carbon (C) and nitrogen (N), and aluminum (Al) can bond to C and N. This can grow a $Si_{(1-v-w-x)}C_wAl_xN_v$ layer formed of a mixed crystal of four elements Si, C, Al, and N.

A method for manufacturing an epitaxial wafer according to the present invention includes the steps of manufacturing a $Si_{(1-v-w-x)}C_wAl_xN_v$ substrate by any of the methods for manufacturing a $Si_{(1-v-w-x)}C_wAl_xN_v$ substrate described above and growing an $Al_{(1-y-z)}Ga_yIn_zN$ layer ($0 \leq y \leq 1$, $0 \leq z \leq 1$, and $0 \leq y+z \leq 1$) on the $Si_{(1-v-w-x)}C_wAl_xN_v$ layer.

A $Si_{(1-v-w-x)}C_wAl_xN_v$ layer having high crystallinity can be manufactured by a method for manufacturing an epitaxial wafer according to the present invention. An $Al_{(1-y-z)}Ga_yIn_zN$ layer having high crystallinity can therefore be grown on the $Si_{(1-v-w-x)}C_wAl_xN_v$ layer. The lattice matching and thermal expansion coefficient of the $Al_{(1-y-z)}Ga_yIn_zN$ layer are similar to the lattice matching and thermal expansion coefficient of the $Si_{(1-v-w-x)}C_wAl_xN_v$ layer. This can improve the crystallinity of the $Al_{(1-y-z)}Ga_yIn_zN$ layer. Low manufacturing costs of the $Si_{(1-v-w-x)}C_wAl_xN_v$ layer allow an epitaxial wafer to be manufactured at reduced costs.

A $Si_{(1-v-w-x)}C_wAl_xN_v$ substrate according to the present invention is a $Si_{(1-v-w-x)}C_wAl_xN_v$ substrate including a $Si_{(1-v-w-x)}C_wAl_xN_v$ layer ($0 \leq v \leq 1$, $0 \leq w \leq 1$, $0 \leq x \leq 1$, and $0 \leq v+w+x \leq 1$) having a main surface and a back surface opposite to the main surface. The component ratio x+v at the main surface of the $Si_{(1-v-w-x)}C_wAl_xN_v$ layer is $0 < x+v < 1$. The x+v increases or decreases monotonically from the back surface to the main surface of the $Si_{(1-v-w-x)}C_wAl_xN_v$ layer.

A $Si_{(1-v-w-x)}C_wAl_xN_v$ substrate that achieves both high crystallinity and low costs can be manufactured by the method for manufacturing a $Si_{(1-v-w-x)}C_wAl_xN_v$ substrate according to the present invention described above.

Preferably, the $Si_{(1-v-w-x)}C_wAl_xN_v$ substrate described above further includes a different type of substrate having a main surface, wherein the back surface of the $Si_{(1-v-w-x)}C_wAl_xN_v$ layer is in contact with the main surface of the different type of substrate, and the component ratio x+v at the back surface is closer to that of the material of the different type of substrate than the component ratio x+v at the main surface of the $Si_{(1-v-w-x)}C_wAl_xN_v$ layer.

Thus, in the case that the $Si_{(1-v-w-x)}C_wAl_xN_v$ layer has a small thickness, the $Si_{(1-v-w-x)}C_wAl_xN_v$ substrate may further include a different type of substrate if necessary.

Preferably, in the $Si_{(1-v-w-x)}C_wAl_xN_v$ substrate described above, the $Si_{(1-v-w-x)}C_wAl_xN_v$ layer includes a plurality of sublayers.

This allows a $Si_{(1-v-w-x)}C_wAl_xN_v$ substrate that achieves high crystallinity and low costs to be easily manufactured.

An epitaxial wafer according to the present invention includes any of the $Si_{(1-v-w-x)}C_wAl_xN_v$ substrates described above and an $Al_{(1-y-z)}Ga_yIn_zN$ layer ($0 \leq y \leq 1$, $0 \leq z \leq 1$, and $0 \leq y+z \leq 1$) formed on the main surface of the $Si_{(1-v-w-x)}C_wAl_xN_v$ layer.

In an epitaxial wafer according to the present invention, an $Al_{(1-y-z)}Ga_yIn_zN$ layer is formed on a $Si_{(1-v-w-x)}C_wAl_xN_v$ layer having high crystallinity. The $Al_{(1-y-z)}Ga_yIn_zN$ layer can therefore have improved crystallinity. The lattice matching and thermal expansion coefficient of the $Al_{(1-y-z)}Ga_yIn_zN$ layer are similar to the lattice matching and thermal expansion coefficient of the $Si_{(1-v-w-x)}C_wAl_xN_v$ layer. This can improve the crystallinity of the $Al_{(1-y-z)}Ga_yIn_zN$ layer. Low manufacturing costs of the $Si_{(1-v-w-x)}C_wAl_xN_v$ layer allow an epitaxial wafer to be manufactured at reduced costs.

Advantageous Effects of Invention

A method for manufacturing a $Si_{(1-v-w-x)}C_wAl_xN_v$ substrate according to the present invention, a method for manufacturing an epitaxial wafer, a $Si_{(1-v-w-x)}C_wAl_xN_v$ substrate, and an epitaxial wafer can reduce a difference in thermal expansion coefficient and lattice mismatch. Thus, a $Si_{(1-v-w-x)}C_wAl_xN_v$ substrate containing $Si_{(1-v-w-x)}C_wAl_xN_v$ crystals that achieve high crystallinity and low costs can be manufactured.

DESCRIPTION OF EMBODIMENTS

Figure 1:
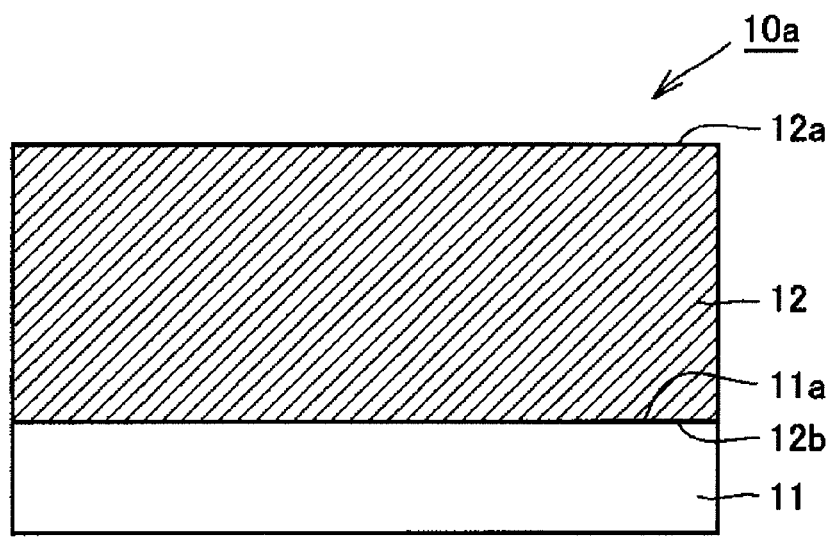
FIG. 1 is a schematic cross-sectional view of a $Si_{(1-v-w-x)}C_wAl_xN_v$ substrate according to a first embodiment of the present invention.

Embodiments of the present invention will be described below with reference to the drawings. In the drawings, identical or similar elements are denoted by like references and will not be described again.

First Embodiment

FIG. 1 is a schematic cross-sectional view of a $Si_{(1-v-w-x)}C_wAl_xN_v$ substrate according to the present embodiment.

First, a $Si_{(1-v-w-x)}C_wAl_xN_v$ substrate 10a according to the present embodiment will be described below with reference to FIG. 1.

As illustrated in FIG. 1, a $Si_{(1-v-w-x)}C_wAl_xN_v$ substrate 10a according to the present embodiment includes a different type of substrate 11 and a $Si_{(1-v-w-x)}C_wAl_xN_v$ layer 12 ($0 \le v \le 1$, $0 \le w \le 1$, $0 \le x \le 1$, and $0 \le v+w+x \le 1$) formed on a main surface 11a of the different type of substrate 11. In the $Si_{(1-v-w-x)}C_wAl_xN_v$ layer 12, the component ratio 1-v-w-x denotes the molar ratio of Si, w denotes the molar ratio of C, x denotes the molar ratio of Al, and v denotes the molar ratio of N.

The different type of substrate 11 is a material different from the $Si_{(1-v-w-x)}C_wAl_xN_v$ layer 12 ($0 \le v \le 1$, $0 \le w \le 1$, $0 \le x \le 1$, and $0 \le v+w+x \le 1$) and may be a Si substrate, a SiC substrate, or an AlN substrate. The different type of substrate is preferably a Si substrate or a sapphire substrate in terms of low costs, more preferably a Si substrate in terms of high processibility.

The different type of substrate 11 preferably has a large diameter, for example, one inch or more, preferably two inches or more. The different type of substrate 11 may have a size of four or six inches.

The $Si_{(1-v-w-x)}C_wAl_xN_v$ layer 12 has a main surface 12a and a back surface 12b opposite to the main surface 12a. The back surface 12b is in contact with the main surface 11a of the different type of substrate 11 and is disposed at the interface between the $Si_{(1-v-w-x)}C_wAl_xN_v$ layer 12 and the different type of substrate 11.

The component ratio x+v increases or decreases monotonically from the interface between the $Si_{(1-v-w-x)}C_wAl_xN_v$ layer 12 and the different type of substrate 11 (the back surface 12b) to the main surface 12a. The term "increase monotonically", as used herein, means that the component ratio x+v is constant or increases from the back surface 12b to the main surface 12a of the $Si_{(1-v-w-x)}C_wAl_xN_v$ layer 12 (in the growth direction) a component ratio x+v is higher at the main surface 12a than at the back surface 12b. Thus, the term "increase monotonically" does not include a portion in which the component ratio x+v decreases in the growth direction. The term "decrease monotonically", as used herein, means that the component ratio x+v is constant or decreases from the back surface 12b to the main surface 12a of the different type of substrate 11 (in the growth direction) and that the component ratio is lower at the main surface 12a than at the back surface 12b. Thus, the term "decrease monotonically" does not include a portion in which the component ratio x+v increases in the growth direction.

The component ratio x+v at the interface between the $Si_{(1-v-w-x)}C_wAl_xN_v$ layer 12 and the different type of substrate 11 (the back surface 12b) is closer to that of the material of the different type of substrate 11 than the component ratio x+v of the main surface 12a. In the case that the different type of substrate 11 is a Si substrate or a SiC substrate, the component ratio x+v of the $Si_{(1-v-w-x)}C_wAl_xN_v$ layer 12 increases monotonically. In the case that the different type of substrate 11 is an AlN substrate, the component ratio x+v of the $Si_{(1-v-w-x)}C_wAl_xN_v$ layer 12 decreases monotonically.

The component ratio x+v at the main surface 12a of the $Si_{(1-v-w-x)}C_wAl_xN_v$ layer 12 is $0 < x+v < 1$. Thus, $Si_{(1-v-w-x)}C_wAl_xN_v$ crystals at the main surface 12a of the $Si_{1-v-w-x}C_wAl_xN_v$ layer 12 contain four elements Si, C, Al, and N. $Si_{(1-v-w-x)}C_wAl_xN_v$ crystals containing four elements forming covalent bonds, which are stronger than ionic bonds, are mechanically harder than AlN.

Figure 2:
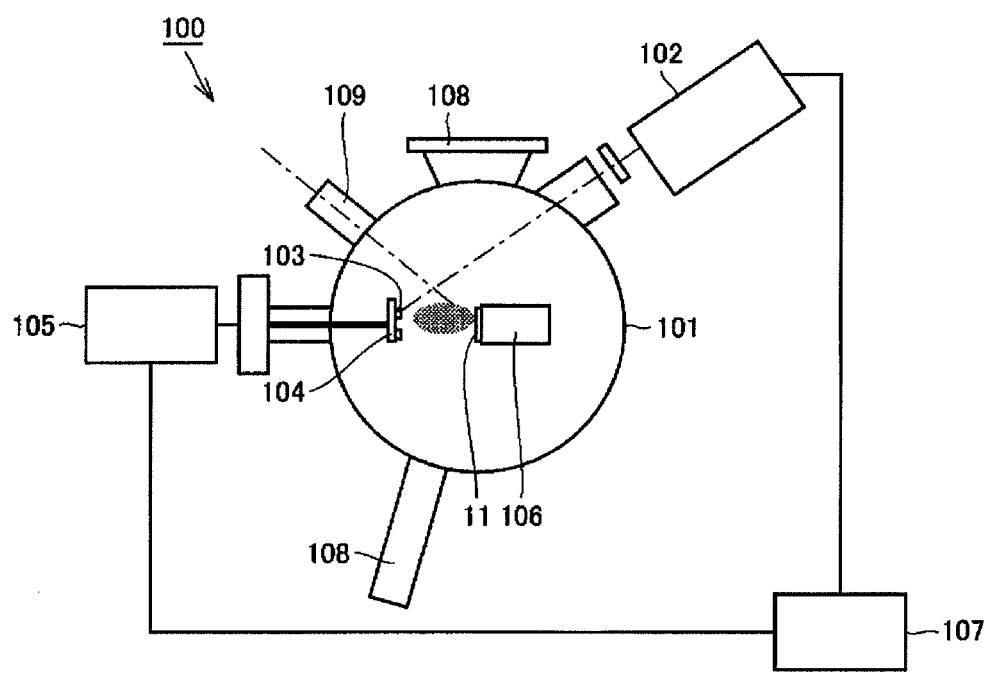
FIG. 2 is a schematic view of a PLD apparatus for use in the manufacture of a $Si_{(1-v-w-x)}C_wAl_xN_v$ substrate according to the first embodiment of the present invention.
Figure 3:
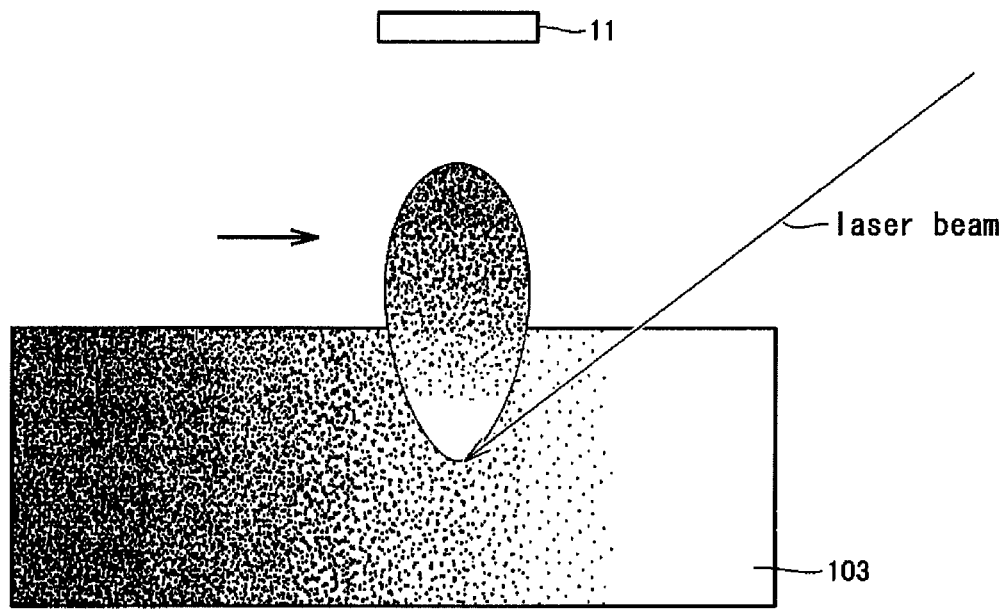
FIG. 3 is a schematic view of the step of growing a $Si_{(1-v-w-x)}C_wAl_xN_v$ layer on a different type of substrate according to the first embodiment of the present invention.

A method for manufacturing a $Si_{(1-v-w-x)}C_wAl_xN_v$ substrate 10a according to the present embodiment will be described below with reference to FIG. 2. In the present embodiment, the $Si_{(1-v-w-x)}C_wAl_xN_v$ substrate 10a is manufactured by a PLD method, for example. FIG. 2 is a schematic view of a PLD apparatus for use in the manufacture of the $Si_{(1-v-w-x)}C_wAl_xN_v$ substrate according to the present embodiment. FIG. 3 is a schematic view of the step of growing a $Si_{(1-v-w-x)}C_wAl_xN_v$ layer on a different type of substrate according to the present embodiment.

The main structure of a PLD apparatus 100 will be described below with reference to FIG. 2. As illustrated in FIG. 2, the PLD apparatus 100 includes a vacuum chamber 101, a laser source 102, a raw material 103, a stage 104, a pulse motor 105, a substrate holder 106, a heater (not shown), a controller 107, a reflection high energy electron diffractometer (RHEED) 108, and a gas-supply unit 109.

The laser source 102 is disposed outside the vacuum chamber 101. The laser source 102 can emit a laser beam. The target raw material 103 can be placed in the vacuum chamber 101 such that the raw material 103 can be irradiated with a laser beam from the laser source 102. The raw material 103 can be mounted on the stage 104. The pulse motor 105 can drive the stage 104. The substrate holder 106 can hold a different type of substrate 11 as the base substrate. The heater heats the different type of substrate 11 in the substrate holder 106. The controller 107 can control the operation of the laser source 102 and the pulse motor 105. The RHEED 108 can monitor oscillations to determine the thickness of the $Si_{(1-v-w-x)}C_wAl_xN_v$ layer 12 grown on the different type of substrate 11. The gas-supply unit 109 can supply a gas into the vacuum chamber 101.

The PLD apparatus 100 may include other components. However, for convenience of explanation, these components are not illustrated or described.

First, the raw material 103 for the $Si_{(1-v-w-x)}C_wAl_xN_v$ layer 12 is prepared. The component ratio x+v of the $Si_{(1-v-w-x)}C_wAl_xN_v$ layer 12 can depend on the molar ratio of SiC to AlN in the raw material 103. In the present embodiment, the raw material 103 is prepared in which, for example, the molar ratio of AlN in a mixture of SiC and AlN increases or decreases monotonically from one end to the other end, as illustrated in FIG. 3. The molar ratio of SiC to AlN is controlled such that $Si_{(1-v-w-x)}C_wAl_xN_v$ crystals on the other end have the component ratio x+v to be manufactured (the component ratio x+v at the main surface 12a). For example, the raw material 103 is a sintered compact of a mixture of SiC and AlN. The raw material 103 thus prepared is placed on the stage 104 in FIG. 2.

The different type of substrate 11 is placed on the surface of the substrate holder 106 in the vacuum chamber 101 such that the different type of substrate 11 faces the raw material 103.

The different type of substrate 11 is then heated. The surface temperature of the different type of substrate 11 is increased to a temperature, for example, below 550° C. The surface temperature of the different type of substrate 11 is preferably below 550° C., more preferably 540° C. or less. This heating is performed, for example, with a heater. A method for heating the different type of substrate 11 is not limited to a heater and may be another method, for example, the application of an electric current. This step can be omitted.

The raw material 103 is then irradiated with a laser beam from the laser source 102. In the present embodiment, the raw material 103 is prepared such that the molar ratio of AlN mixing SiC and AlN increases or decreases monotonically from one end to the other end and such that $Si_{(1-v-w-x)}C_wAl_xN_v$ crystals at the other end has a component ratio x+v to be manufactured. As illustrated in FIG. 3, the raw material 103 is irradiated with a laser beam from one end (the left end in FIG. 3) to the other end (the right end in FIG. 3) (in the direction of the arrow in FIG. 3). In this case, the raw material 103 is deposited as the $Si_{(1-v-w-x)}C_wAl_xN_v$ layer 12 on the different type of substrate 11 from one end to the other end. Thus, $Si_{(1-v-w-x)}C_wAl_xN_v$ crystals having a component ratio x+v corresponding to the molar ratio at one end are grown at the interface between the $Si_{(1-v-w-x)}C_wAl_xN_v$ layer 12 and the different type of substrate 11, and $Si_{(1-v-w-x)}C_wAl_xN_v$ crystals having a component ratio x+v corresponding to the molar ratio at the other end are grown at the main surface of the $Si_{(1-v-w-x)}C_wAl_xN_v$ layer 12.

The laser may be krypton fluoride (KrF) excimer laser having an emission wavelength of 248 nm, a pulse repetition frequency of 10 Hz, and a pulse energy in the range of 1 to 3 J/shot. Another laser, such as argon fluoride (ArF) excimer laser having an emission wavelength of 193 nm, may also be used.

The vacuum chamber 101 can be evacuated to a pressure in the range of approximately $1\times10^{-3}$ to $1\times10^{-6}$ Torr or less, for example. The vacuum chamber 101 is then filled with an inert gas, such as argon (Ar), or nitrogen from the gas-supply unit 109. The nitrogen atmosphere in the vacuum chamber 101 can supply nitrogen during the growth of the $Si_{(1-v-w-x)}C_wAl_xN_v$ layer 12. In the inert gas atmosphere in the vacuum chamber, only the raw material 103 is used in the growth of the $Si_{(1-v-w-x)}C_wAl_xN_v$ layer 12. This facilitates the control of x+v.

The raw material 103 is preferably irradiated with a laser beam having a short wavelength as described above. Use of a short-wavelength laser beam increases the absorption coefficient, allowing most of the laser beam to be absorbed in the vicinity of the surface of the raw material 103. This can markedly increase the surface temperature of the raw material 103, generating ablation plasma (plume) in the vacuum chamber 101. Ablation plasma is plasma accompanied by explosive particle emission from a solid. Ablation particles in the plasma move to the different type of substrate 11 while the state of the ablation particles alters by recombination, collision with ambient gas, a reaction, or the like. The particles reaching the different type of substrate 11 diffuse over the different type of substrate 11 and enter acceptor sites to form the $Si_{(1-v-w-x)}C_wAl_xN_v$ layer 12.

The following are acceptor sites for the particles. The acceptor site for an Al atom is a C or N atom binding site. The acceptor site for a Si atom is a C or N atom binding site. The acceptor site for a C atom is an Al or Si atom binding site. The acceptor site for a N atom is an Al or Si atom binding site.

The thickness of the $Si_{(1-v-w-x)}C_wAl_xN_v$ layer 12 to be grown can be monitored through the oscillation of the RHEED 108 installed on the vacuum chamber 101.

Through the steps described above, the $Si_{(1-v-w-x)}C_wAl_xN_v$ layer 12 can be grown on the different type of substrate 11 by a PLD method to manufacture the $Si_{(1-v-w-x)}C_wAl_xN_v$ substrate 10a illustrated in FIG. 1.

Although the $Si_{(1-v-w-x)}C_wAl_xN_v$ layer 12 is grown by the PLD method in the present embodiment, the $Si_{(1-v-w-x)}C_wAl_xN_v$ layer 12 may be grown by another method. For example, the $Si_{(1-v-w-x)}C_wAl_xN_v$ layer 12 may be grown by a pulsed metalorganic chemical vapor deposition (MOCVD) method, a gas source molecular beam epitaxy (MBE) method, or a sputtering method. In the pulsed MOCVD method, the gas flow rate can be altered to grow the $Si_{(1-v-w-x)}C_wAl_xN_v$ layer 12. In the gas source MBE method, for example, the opening and closing of a cell and the heating temperature can be controlled to grow the $Si_{(1-v-w-x)}C_wAl_xN_v$ layer 12. In the sputtering method, for example, a target can be controlled to grow the $Si_{(1-v-w-x)}C_wAl_xN_v$ layer 12.

As described above, in the $Si_{(1-v-w-x)}C_wAl_xN_v$ substrate 10a and a manufacturing method thereof according to the present embodiment, the component ratio x+v at the main surface 12a of the $Si_{(1-v-w-x)}C_wAl_xN_v$ layer 12 is 0<x+v<1, the component ratio x+v increases or decreases monotonically from the interface between the $Si_{(1-v-w-x)}C_wAl_xN_v$ layer 12 and the different type of substrate 11 (the back surface 12b) to the main surface 12a, and the component ratio x+v at the interface between the $Si_{(1-v-w-x)}C_wAl_xN_v$ layer 12 and the different type of substrate 11 (the back surface 12b) is closer to that of the material of the different type of substrate 11 than the component ratio x+v of the main surface 12a.

In accordance with the $Si_{(1-v-w-x)}C_wAl_xN_v$ substrate 10a and a manufacturing method thereof according to the present embodiment, the $Si_{(1-v-w-x)}C_wAl_xN_v$ layer 12 is grown such that the component ratio x+v approaches to a component ratio x+v to be manufactured from the interface between the $Si_{(1-v-w-x)}C_wAl_xN_v$ layer 12 and the different type of substrate 11 to $Si_{(1-v-w-x)}C_wAl_xN_v$ crystals having the component ratio x+v to be manufactured. In other words, the $Si_{(1-v-w-x)}C_wAl_xN_v$ layer 12 is grown such that the component ratio x+v alters monotonously in the growth direction of the $Si_{(1-v-w-x)}C_wAl_xN_v$ layer 12. Thus, $Si_{(1-v-w-x)}C_wAl_xN_v$ crystals having a component ratio x+v between the $Si_{(1-v-w-x)}C_wAl_xN_v$ layer 12 at the main surface 12a and the different type of substrate 11 are grown between the $Si_{(1-v-w-x)}C_wAl_xN_v$ layer 12 at the main surface 12a and the different type of substrate 11. The difference in lattice constant and the difference in thermal expansion coefficient between $Si_{(1-v-w-x)}C_wAl_xN_v$ crystals having a component ratio x+v between them and the different type of substrate 11 and the difference in lattice constant and the difference in thermal expansion coefficient between the $Si_{(1-v-w-x)}C_wAl_xN_v$ crystals having a component ratio x+v between them and $Si_{(1-v-w-x)}C_wAl_xN_v$ crystals to be manufactured are smaller than the difference in lattice constant and the difference in thermal expansion coefficient between the $Si_{(1-v-w-x)}C_wAl_xN_v$ layer having the component ratio x+v to be manufactured and the different type of substrate 11. $Si_{(1-v-w-x)}C_wAl_xN_v$ crystals having a component ratio x+v to be manufactured can be grown at the main surface 12a to gradually reduce the lattice mismatch and the difference in thermal expansion coefficient between the $Si_{(1-v-w-x)}C_wAl_xN_v$ crystals to be manufactured and the different type of substrate 11. Such a superlattice structure can reduce the strain and fracture of $Si_{(1-v-w-x)}C_wAl_xN_v$ crystals having a component ratio x+v at the main surface 12a, that is, a component ratio x+v to be manufactured, of the $Si_{(1-v-w-x)}C_wAl_xN_v$ layer 12. This can improve the crystallinity of $Si_{(1-v-w-x)}C_wAl_xN_v$ crystals at the main surface 12a and having a component ratio x+v to be manufactured.

The crystallinity of $Si_{(1-v-w-x)}C_wAl_xN_v$ crystals at the main surface 12a and having a component ratio x+v of the $Si_{(1-v-w-x)}C_wAl_xN_v$ layer 12 can be improved without increasing the thickness of $Si_{(1-v-w-x)}C_wAl_xN_v$ crystals having a component ratio x+v between the main surface 12a and the back surface 12b. This obviates the need to manufacture $Si_{(1-v-w-x)}C_wAl_xN_v$ crystals having a component ratio x+v between them as the base substrate. This can reduce the costs required to manufacture $Si_{(1-v-w-x)}C_wAl_xN_v$ crystals to be manufactured.

Thus, the crystallinity of $Si_{(1-v-w-x)}C_wAl_xN_v$ crystals having a component ratio x+v to be manufactured on a certain base substrate can be improved. Furthermore, costs can be reduced to manufacture a $Si_{(1-v-w-x)}C_wAl_xN_v$ substrate 10a containing $Si_{(1-v-w-x)}C_wAl_xN_v$ crystals having desired crystallinity. Thus, a $Si_{(1-v-w-x)}C_wAl_xN_v$ substrate that achieves both high crystallinity and low costs can be manufactured.

In the method for manufacturing a $Si_{(1-v-w-x)}C_wAl_xN_v$ substrate 10a, the $Si_{(1-v-w-x)}C_wAl_xN_v$ layer 12 is preferably grown by the PLD method.

The raw material 103 for the $Si_{(1-v-w-x)}C_wAl_xN_v$ layer 12 can be irradiated with a laser beam to generate plasma. The plasma can be supplied onto the different type of substrate 11. Thus, the $Si_{(1-v-w-x)}C_wAl_xN_v$ layer 12 can be grown in a non-equilibrium state. Unlike the equilibrium state, this non-equilibrium state is not a stable state. Si can therefore bond to C and N, and Al can bond to C and N. This can grow the $Si_{(1-v-w-x)}C_wAl_xN_v$ layer 12 formed of a mixed crystal of four elements Si, C, Al, and N. Thus, the component ratio x+v can be easily controlled by growing the $Si_{(1-v-w-x)}C_wAl_xN_v$ layer 12 by the PLD method. The PLD method is suitable for the method for manufacturing a $Si_{(1-v-w-x)}C_wAl_xN_v$ substrate 10a according to the present embodiment.

Because SiC and AlN are stable in a $Si_{(1-v-w-x)}C_wAl_xN_v$ layer grown in an equilibrium state, Si bonds to C, and Al bonds to N. Thus, SiC layers and AlN layers are often layered, or a SiC layer is often interspersed with aggregated AlN layers.

The $Si_{(1-v-w-x)}C_wAl_xN_v$ layer 12 grown by the PLD method can provide the $Si_{(1-v-w-x)}C_wAl_xN_v$ substrate 10a including the $Si_{(1-v-w-x)}C_wAl_xN_v$ layer 12 having a diffract between the SiC diffraction peak and the AlN diffraction peak as determined by an X-ray diffraction (XRD) method.

The diffraction peaks of the materials as determined by the XRD method have their inherent values. For example, under measurement conditions where the target is copper (Cu), the tube voltage is 45 kV, the tube current is 40 mA, the measurement mode is 2θ-ω, and the angular resolution is 0.001 degree step, the diffraction peak of an AlN (002) plane appears at approximately 36.03 degrees, and the diffraction peak of a SiC (102) plane appears at approximately 35.72 degrees. The diffraction peak of the $Si_{(1-v-w-x)}C_wAl_xN_v$ layer 12 manufactured by the PLD method under these conditions appears between 35.72 and 36.03 degrees.

In the XRD measurement of a $Si_{(1-v-w-x)}C_wAl_xN_v$ layer 12 grown in an equilibrium state, for example, by a sublimation method or a MBE method, the SiC diffraction peak and the AlN diffraction peak are observed, but no diffraction peak is observed between the SiC diffraction peak and the AlN diffraction peak. A diffraction peak within the limits of error, such as noise, may be observed between the SiC diffraction peak and the AlN diffraction peak.

In the $Si_{(1-v-w-x)}C_wAl_xN_v$ substrate 10a and the manufacturing method thereof described above, the different type of substrate 11 is preferably a Si substrate.

Si substrates are the most commonly used electronic materials, and therefore processing techniques, such as etching, have been established for the Si substrates. Si substrates can be easily cleaved and easily etched with an acid. It is therefore easy to reduce the thickness of a Si substrate or remove a Si substrate. When the $Si_{(1-v-w-x)}C_wAl_xN_v$ substrate 10a is used in the manufacture of a light-emitting device, the cleavability of the Si substrate is very important. Thus, an easily processable $Si_{(1-v-w-x)}C_wAl_xN_v$ substrate 10a can be manufactured.

Si substrates are less expensive than SiC substrates and sapphire substrates. This can reduce the manufacturing costs of the $Si_{(1-v-w-x)}C_wAl_xN_v$ substrate 10a.

In particular, in the growth of the $Si_{(1-v-w-x)}C_wAl_xN_v$ layer 12 by the PLD method, the $Si_{(1-v-w-x)}C_wAl_xN_v$ layer 12 can be grown at low temperature. This can prevent the degradation of the Si substrate, allowing the $Si_{(1-v-w-x)}C_wAl_xN_v$ layer 12 to be grown in a large area.

The $Si_{(1-v-w-x)}C_wAl_xN_v$ substrate 10a manufactured by a method for manufacturing a $Si_{(1-v-w-x)}C_wAl_xN_v$ substrate 10a according to the present embodiment therefore achieves both high crystallinity and low costs. The $Si_{(1-v-w-x)}C_wAl_xN_v$ substrate 10a can be suitably used in various functional devices that utilize the magnetoresistance effect, such as tunneling magnetoresistive devices and giant magnetoresistive devices; light-emitting devices, such as light-emitting diodes and laser diodes; electronic devices, such as rectifiers, bipolar transistors, field-effect transistors (FETs), spin FETs, and high-electron-mobility transistors (HEMTs); semiconductor sensors, such as temperature sensors, pressure sensors, radiation sensors, and visible-ultraviolet light detectors; and SAW devices.

Second Embodiment

Figure 4:
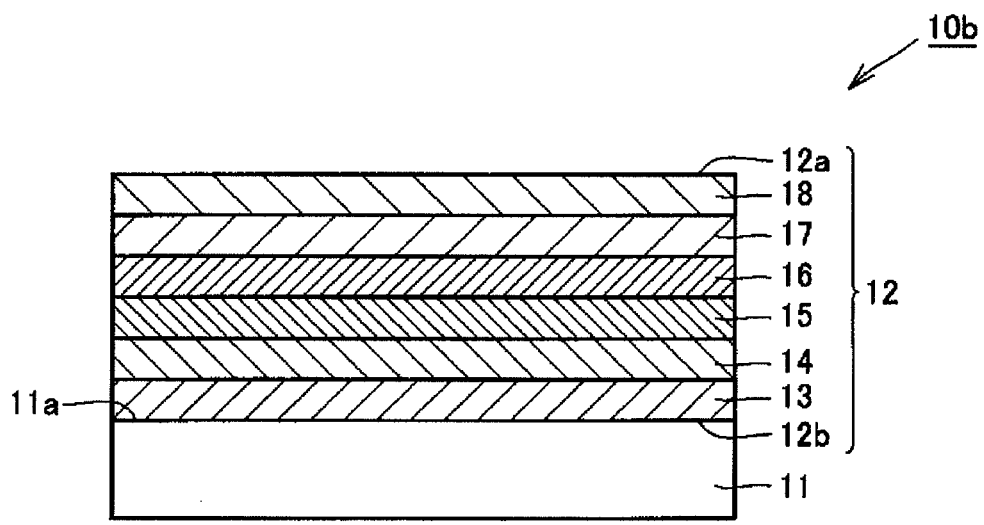
FIG. 4 is a schematic cross-sectional view of a $Si_{(1-v-w-x)}C_wAl_xN_v$ substrate according to a second embodiment of the present invention.

FIG. 4 is a schematic cross-sectional view of a $Si_{(1-v-w-x)}C_wAl_xN_v$ substrate according to a second embodiment of the present invention. With reference to FIG. 4, a $Si_{(1-v-w-x)}C_wAl_xN_v$ substrate 10b according to the present embodiment basically has the same structure as in the first embodiment except that a $Si_{(1-v-w-x)}C_wAl_xN_v$ layer 12 includes a plurality of sublayers.

More specifically, as illustrated in FIG. 4, the $Si_{(1-v-w-x)}C_wAl_xN_v$ layer 12 includes a first sublayer 13, a second sublayer 14, a third sublayer 15, a fourth sublayer 16, a fifth sublayer 17, and a sixth sublayer 18. The first, second, third, fourth, fifth, and sixth sublayers 13, 14, 15, 16, 17, and 18 are stacked on a different type of substrate 11 in this order. The component ratios x+v of the first, second, third, fourth, fifth, and sixth sublayers 13, 14, 15, 16, 17, and 18 increase or decrease in this order. In the case that the different type of substrate 11 is an AlN substrate, the component ratios x+v of the first, second, third, fourth, fifth, and sixth sublayers 13, 14, 15, 16, 17, and 18 increase in this order. In the case that the different type of substrate 11 is a Si substrate or a SiC substrate, the component ratios x+v of the first, second, third, fourth, fifth, and sixth sublayers 13, 14, 15, 16, 17, and 18 decrease in this order.

Figure 5:
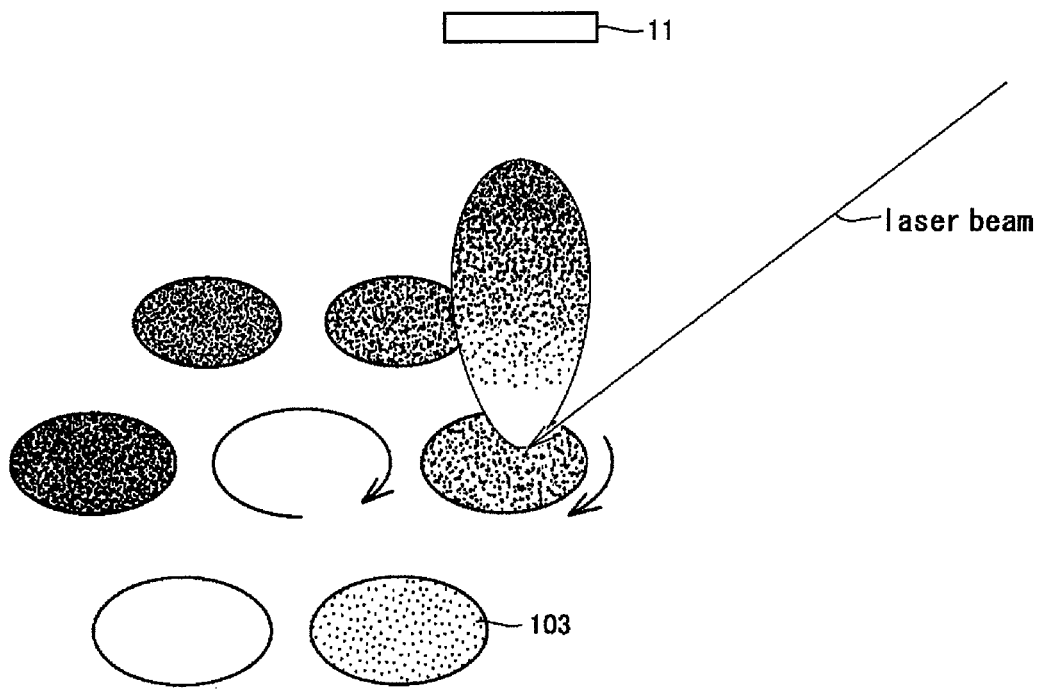
FIG. 5 is a schematic view of the step of growing a $Si_{(1-v-w-x)}C_wAl_xN_v$ layer on a different type of substrate according to the second embodiment of the present invention.

A method for manufacturing a $Si_{(1-v-w-x)}C_wAl_xN_v$ substrate 10b according to the present embodiment will be described below with reference to FIGS. 2 and 5. FIG. 5 is a schematic view of the step of growing a $Si_{(1-v-w-x)}C_wAl_xN_v$ layer on a different type of substrate according to the present embodiment.

A method for manufacturing a $Si_{(1-v-w-x)}C_wAl_xN_v$ substrate 10b according to the present embodiment basically has the same structure as the method for manufacturing a $Si_{(1-v-w-x)}C_wAl_xN_v$ substrate 10a according to the first embodiment except for the step of preparing a raw material 103 and the step of irradiating the raw material 103 with a laser beam.

More specifically, as illustrated in FIG. 5, in the step of preparing a raw material 103, at least two materials are prepared at different molar ratios of SiC to AlN. These materials are placed on a stage 104 in FIG. 2. The materials are preferably placed in decreasing (or increasing) order of the molar ratio of AlN mixing SiC and AlN. In this case, a laser beam can be emitted while being moved in a certain direction to facilitate the growth of the $Si_{(1-v-w-x)}C_wAl_xN_v$ layer 12 having a monotonically increasing or decreasing component ratio x+v. The materials may be alternately irradiated with a laser beam in a vacuum chamber 101 while the direction of radiation of the laser beam is fixed. In this case, the materials can be arranged in decreasing order of AlN molar ratio to facilitate the replacement of the materials.

As illustrated in FIG. 3, the raw material 103 may have a gradually altered molar ratio of SiC to AlN in one sintered compact.

In the step of irradiating the raw material 103 with a laser beam from a laser source 102, the materials of the raw material 103 are sequentially irradiated with a laser beam from a material for a $Si_{(1-v-w-x)}C_wAl_xN_v$ layer 12 having a component ratio x+v closer to the different type of substrate 11 to a material for a $Si_{(1-v-w-x)}C_wAl_xN_v$ layer 12 having a component ratio x+v to be manufactured (the sixth sublayer 18 in the present embodiment) (in the direction of the arrow in FIG. 5). The first, second, third, fourth, fifth, and sixth sublayers 13, 14, 15, 16, 17, and 18 corresponding to the molar ratios of the materials of the raw material 103 can be sequentially grown on the different type of substrate 11.

Although the plurality of sublayers in the $Si_{(1-v-w-x)}C_wAl_xN_v$ layer 12 are six sublayers in the present embodiment, the plurality of sublayers may be two sublayers or more. The first, second, third, fourth, fifth, and sixth sublayers 13, 14, 15, 16, 17, and 18 may include sublayers of the same composition provided that the component ratio x+v of the first sublayer 13 is different from the component ratio x+v of the sixth sublayer 18.

As described above, in accordance with the $Si_{(1-v-w-x)}C_wAl_xN_v$ substrate 10b and a manufacturing method thereof according to the present embodiment, the $Si_{(1-v-w-x)}C_wAl_xN_v$ layer 12 includes a plurality of sublayers.

In the plurality of sublayers, the component ratio x+v gradually increases or decreases from the component ratio x+v of a sublayer close to the different type of substrate 11 (to a back surface 12b) to the component ratio x+v of a sublayer at a main surface 12a. The raw material 103 containing a plurality of materials for the sublayers can be prepared to grow the $Si_{(1-v-w-x)}C_wAl_xN_v$ layer 12 having a plurality of sublayers. Thus, the $Si_{(1-v-w-x)}C_wAl_xN_v$ layer 12 that achieves both high crystallinity and low costs can be easily manufactured.

In accordance with a method for manufacturing a $Si_{(1-v-w-x)}C_wAl_xN_v$ substrate 10b according to the present embodiment, for example, a Si substrate can be used as the different type of substrate 11, and the $Si_{(1-v-w-x)}C_wAl_xN_v$ layer 12 can be manufactured in which the first sublayer 13 is a SiC layer and the second sublayer 14 is a $Si_{(1-v-w-x)}C_wAl_xN_v$ (0<v<1, 0<w<1, 0<x<1, and 0<v+w+x<1) layer. The crystallinity of the $Si_{(1-v-w-x)}C_wAl_xN_v$ (0<v<1, 0<w<1, 0<x<1, and 0<v+w+x<1) layer serving as the second sublayer 14 is substantially the same as the crystallinity of a $Si_{(1-v-w-x)}C_wAl_xN_v$ (0<v<1, 0<w<1, 0<x<1, and 0<v+w+x<1) layer having the same component ratio x+v grown on the SiC substrate as a comparative example. However, even if the SiC layer serving as the first sublayer 13 according to the present embodiment has a smaller thickness than the SiC substrate in the comparative example, the $Si_{(1-v-w-x)}C_wAl_xN_v$(0<v<1, 0<w<1, 0<x<1, and 0<v+w+x<1) layer has substantially the same crystallinity. The formation of a SiC layer as the first sublayer 13 rather than a SiC substrate serving as a different type of substrate required for crystal growth can reduce the manufacturing costs of the $Si_{(1-v-w-x)}C_wAl_xN_v$ layer 12.

Provided that the $Si_{(1-v-w-x)}C_wAl_xN_v$ crystals at the main surface 12a of the $Si_{(1-v-w-x)}C_wAl_xN_v$ layer 12 contain four elements Si, C, Al, and N, the back surface 12b may be crystals composed of two elements, such as SiC or AlN.

Third Embodiment

Figure 6:
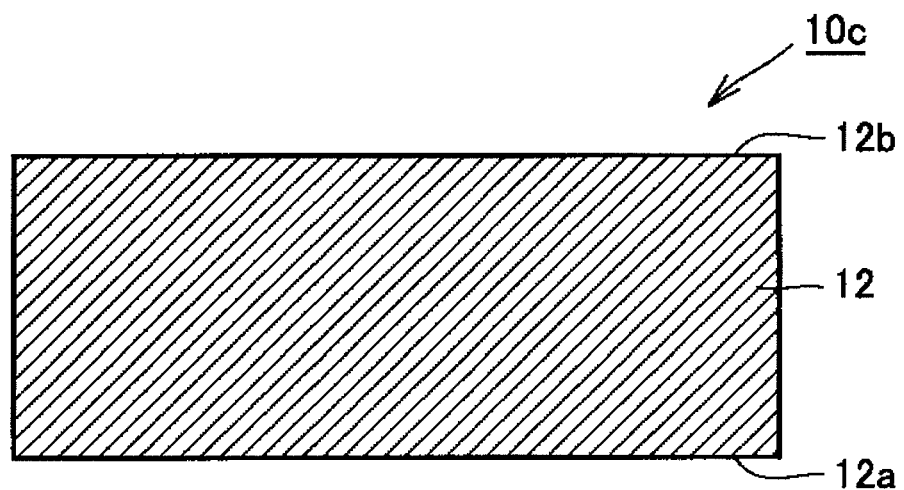
FIG. 6 is a schematic cross-sectional view of a $Si_{(1-v-w-x)}C_wAl_xN_v$ substrate according to a third embodiment of the present invention.

FIG. 6 is a schematic cross-sectional view of a $Si_{(1-v-w-x)}C_wAl_xN_v$ substrate according to the present embodiment. With reference to FIG. 6, in a $Si_{(1-v-w-x)}C_wAl_xN_v$ substrate 10c according to the present embodiment, at least the different type of substrate 11 is removed from the $Si_{(1-v-w-x)}C_wAl_xN_v$ substrate 10a according to the first embodiment.

A method for manufacturing a $Si_{(1-v-w-x)}C_wAl_xN_v$ substrate 10c according to the present embodiment will be described below.

First, the $Si_{(1-v-w-x)}C_wAl_xN_v$ substrate 10a illustrated in FIG. 1 is manufactured by the method for manufacturing a $Si_{(1-v-w-x)}C_wAl_xN_v$ substrate 10a according to the first embodiment.

The different type of substrate 11 is then removed. Only the different type of substrate 11 may be removed, or the different type of substrate 11 and part of the $Si_{(1-v-w-x)}C_wAl_xN_v$ layer 12 including the surface in contact with the different type of substrate 11 may be removed.

The removal can be performed by any method, for example, chemical removal, such as etching, or mechanical removal, such as cutting, grinding, or cleavage. Cutting refers to the mechanical removal of at least the different type of substrate 11 from the $Si_{(1-v-w-x)}C_wAl_xN_v$ layer 12 with a slicer having a peripheral cutting edge of an electrodeposited diamond wheel. Grinding refers to applying a rotating whetstone to a surface to scrape the surface in the thickness direction. Cleavage refers to cleaving the different type of substrate 11 along the crystal lattice plane.

As described above, the $Si_{(1-v-w-x)}C_wAl_xN_v$ substrate 10c and a method for manufacturing a $Si_{(1-v-w-x)}C_wAl_xN_v$ substrate 10c according to the present embodiment further include a step of removing the different type of substrate 11. This allows the $Si_{(1-v-w-x)}C_wAl_xN_v$ layer 12 that does not include the different type of substrate 11 and that achieves both high crystallinity and low costs to be manufactured.

Fourth Embodiment

Figure 7:
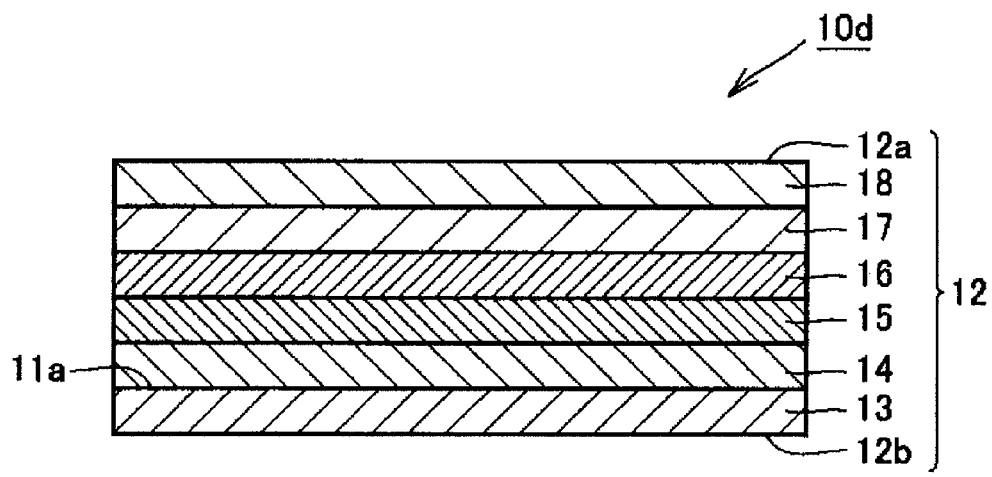
FIG. 7 is a schematic cross-sectional view of a $Si_{(1-v-w-x)}C_wAl_xN_v$ substrate according to a fourth embodiment of the present invention.

FIG. 7 is a schematic cross-sectional view of a $Si_{(1-v-w-x)}C_wAl_xN_v$ substrate according to the present embodiment. With reference to FIG. 7, in a $Si_{(1-v-w-x)}C_wAl_xN_v$ substrate 10d according to the present embodiment, at least the different type of substrate 11 is removed from the $Si_{(1-v-w-x)}C_wAl_xN_v$ substrate 10b according to the second embodiment.

A method for manufacturing a $Si_{(1-v-w-x)}C_wAl_xN_v$ substrate 10d according to the present embodiment will be described below.

First, the $Si_{(1-v-w-x)}C_wAl_xN_v$ substrate 10b illustrated in FIG. 4 is manufactured by the method for manufacturing a $Si_{(1-v-w-x)}C_wAl_xN_v$ substrate 10b according to the second embodiment.

The different type of substrate 11 is then removed. Only the different type of substrate 11 may be removed, or the different type of substrate 11 and any sublayer of the first, second, third, fourth, and fifth sublayers 13, 14, 15, 16, and 17 of the $Si_{(1-v-w-x)}C_wAl_xN_v$ layer 12 may be removed. The removal can be performed in the same manner as in the third embodiment and will not be further described.

As described above, the $Si_{(1-v-w-x)}C_wAl_xN_v$ substrate 10d and a method for manufacturing a $Si_{(1-v-w-x)}C_wAl_xN_v$ substrate 10d according to the present embodiment further include a step of removing the different type of substrate 11. This allows the $Si_{(1-v-w-x)}C_wAl_xN_v$ layer 12 that does not include the different type of substrate 11 and that achieves both high crystallinity and low costs to be manufactured.

Fifth Embodiment

Figure 8:
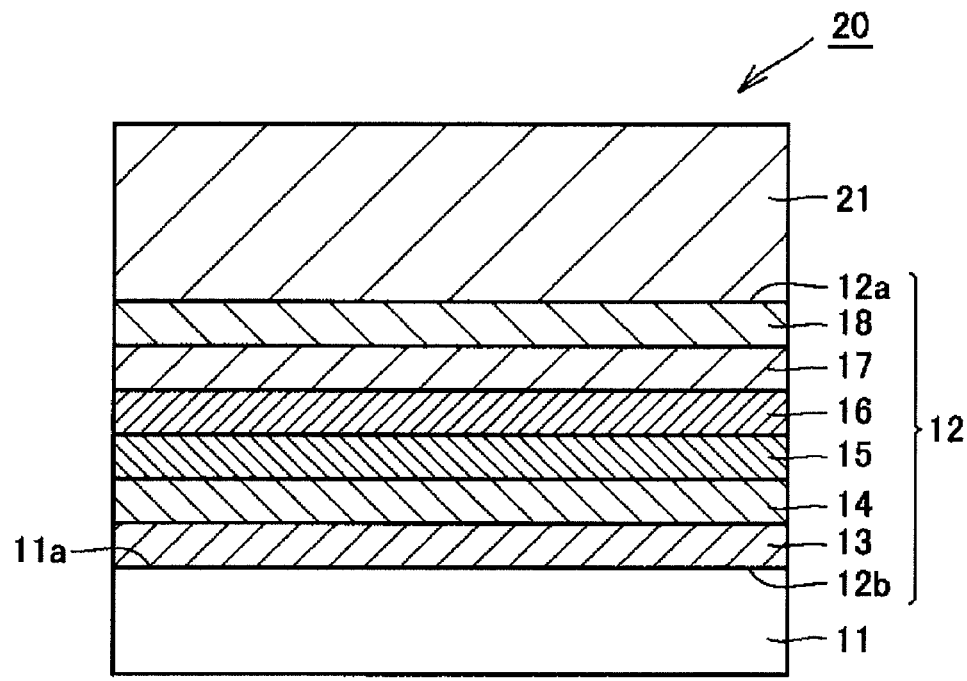
FIG. 8 is a schematic cross-sectional view of an epitaxial wafer according to a fifth embodiment of the present invention.

FIG. 8 is a schematic cross-sectional view of an epitaxial wafer according to the present embodiment. An epitaxial wafer 20 according to the present embodiment will be described below with reference to FIG. 8.

As illustrated in FIG. 8, the epitaxial wafer 20 includes the $Si_{(1-v-w-x)}C_wAl_xN_v$ substrate 10b according to the second embodiment and an $Al_{(1-y-z)}Ga_yIn_zN$ (0≤y≤1, 0≤z≤1, and 0≤y+z≤1) layer 21 formed on the $Si_{(1-v-w-x)}C_wAl_xN_v$ substrate 10b. In other words, the epitaxial wafer 20 includes the different type of substrate 11, the $Si_{(1-v-w-x)}C_wAl_xN_v$ layer 12 formed on the different type of substrate 11, and the $Al_{(1-y-z)}Ga_yIn_zN$ layer 21 formed on the main surface 12a of the $Si_{(1-v-w-x)}C_wAl_xN_v$ layer 12.

A method for manufacturing an epitaxial wafer 20 according to the present embodiment will be described below.

First, the $Si_{(1-v-w-x)}C_wAl_xN_v$ substrate 10b is manufactured by the method for manufacturing a $Si_{(1-v-w-x)}C_wAl_xN_v$ substrate 10b according to the first embodiment.

The $Al_{(1-y-z)}Ga_yIn_zN$ layer 21 is then grown on the $Si_{(1-v-w-x)}C_wAl_xN_v$ substrate 10b (the main surface 12a of the $Si_{(1-v-w-x)}C_wAl_xN_v$ layer 12 in the present embodiment). Examples of the growth method include, but not limited to, vapor phase epitaxy methods, such as an MOCVD method, a hydride vapor phase epitaxy (HYPE) method, an MBE method, and a sublimation method, and liquid phase epitaxy methods.

Through these steps, the epitaxial wafer 20 illustrated in FIG. 8 can be manufactured. A step of removing the different type of substrate 11 from the epitaxial wafer 20 may be further performed. The $Si_{(1-v-w-x)}C_wAl_xN_v$ substrate 10b according to the second embodiment may be replaced with the $Si_{(1-v-w-x)}C_wAl_xN_v$ substrate 10a according to the first embodiment.

As described above, in accordance with the epitaxial wafer 20 and the manufacturing method thereof according to the present embodiment, the $Al_{(1-y-z)}Ga_yIn_zN$ layer 21 is formed on the $Si_{(1-v-w-x)}C_wAl_xN_v$ substrate 10b. The $Si_{(1-v-w-x)}C_wAl_xN_v$ crystals at the main surface 12a of the $Si_{(1-v-w-x)}C_wAl_xN_v$ layer 12 of the $Si_{(1-v-w-x)}C_wAl_xN_v$ substrate 10b have high crystallinity. An $Al_{(1-y-z)}Ga_yIn_zN$ layer 21 having high crystallinity can therefore be grown on the main surface 12a of the $Si_{(1-v-w-x)}C_wAl_xN_v$ layer 12. Furthermore, because differences in lattice matching and thermal expansion coefficient between the $Al_{(1-y-z)}Ga_yIn_zN$ layer and the $Si_{(1-v-w-x)}C_wAl_xN_v$ layer 21 are small, the $Al_{(1-y-z)}Ga_yIn_zN$ layer 12 can have improved crystallinity. Furthermore, a low cost of the $Si_{(1-v-w-x)}C_wAl_xN_v$ substrate 10b can reduce the manufacturing costs of the epitaxial wafer 20.

EXAMPLE

In the present example, the effects of growing a $Si_{(1-v-w-x)}C_wAl_xN_v$ layer such that the component ratio x+v increases or decreases monotonically from the interface between the $Si_{(1-v-w-x)}C_wAl_xN_v$ layer and a different type of substrate to the main surface of the $Si_{(1-v-w-x)}C_wAl_xN_v$ layer were investigated.

Working Example 1

Figure 9:
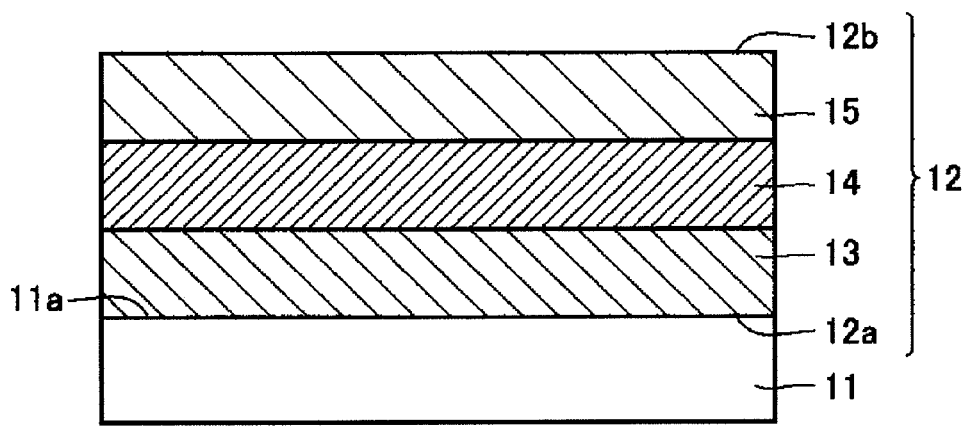
FIG. 9 is a schematic cross-sectional view of a $Si_{(1-v-w-x)}C_wAl_xN_v$ substrate according to Working Examples 1 and 2.

In Working Example 1, a $Si_{(1-v-w-x)}C_wAl_xN_v$ substrate 10a including a three-layer $Si_{(1-v-w-x)}C_wAl_xN_v$ layer as illustrated in FIG. 9 was basically manufactured by the method for manufacturing a $Si_{(1-v-w-x)}C_wAl_xN_v$ substrate 10b according to the second embodiment with a PLD apparatus illustrated in FIG. 2. The component ratio x+v to be manufactured was 0.9 ($Si_{0.05}C_{0.05}Al_{0.45}N_{0.45}$). FIG. 9 is a schematic cross-sectional view of a $Si_{(1-v-w-x)}C_wAl_xN_v$ substrate according to Working Example 1.

More specifically, a raw material 103 for a $Si_{(1-v-w-x)}C_wAl_xN_v$ layer 12 was first prepared. The raw material 103 was prepared in the following way. More specifically, a SiC powder and an AlN powder were mixed at three molar ratios. Each mixture was pressed. In one of the three mixtures, only a SiC powder was pressed. The three mixtures were placed in a vacuum vessel. After the vacuum vessel was evacuated to $10^{-6}$ Torr, the atmosphere was filled with a high-purity nitrogen gas. The three mixtures were then fired at 2300° C. for 20 hours. Thus, the raw material 103 composed of three sintered compact materials was prepared. The raw material 103 composed of three materials was set on a stage 104 illustrated in FIG. 2 in increasing order of AlN molar ratio.

A Si substrate was prepared as a different type of substrate 11. This Si substrate had a (001) plane as a main surface 11a and a size of two inches. The different type of substrate 11 was placed on the surface of a substrate holder 106 in a vacuum chamber 101 such that the Si substrate 11 faced the raw material 103.

The surface of the different type of substrate 11 was then heated to a temperature of 600° C. A material having the lowest AlN molar ratio of the raw material 103, that is, a SiC sintered compact free of AlN was then irradiated with a laser beam from a laser source 102. This grew a first sublayer 13 of SiC having a thickness of 100 nm on the different type of substrate 11. A material having a second-lowest AlN molar ratio of the raw material 103 was irradiated with a laser beam. This grew a second sublayer 14 of $Si_{0.45}C_{0.45}Al_{0.05}N_{0.05}$ having a thickness of 100 nm on the first sublayer 13. A material having a third-lowest AlN molar ratio of the raw material 103, that is, a material having the highest AlN molar ratio was then irradiated with a laser beam. This grew a third sublayer 15 of $Si_{0.05}C_{0.05}Al_{0.45}N_{0.45}$ having a thickness of 100 nm on the second sublayer 14.

The thicknesses of the first, second, and third layers 13, 14, and 15 were monitored through the oscillation of a RHEED 108 installed on the vacuum chamber 101. A $Si_{(1-v-w-x)}C_wAl_xN_v$ layer 12 having a total thickness of 300 nm was thus grown.

The laser was KrF excimer laser having an emission wavelength of 248 nm, a pulse repetition frequency of 10 Hz, and a pulse energy in the range of 1 to 3 J/shot.

In this process, the vacuum chamber 101 was evacuated to $1\times10^{-6}$ Torr and was then filled with nitrogen.

Through the steps described above, a $Si_{(1-v-w-x)}C_wAl_xN_v$ substrate illustrated in FIG. 9 was manufactured.

Working Example 2

In Working Example 2, a $Si_{(1-v-w-x)}C_wAl_xN_v$ substrate was manufactured basically in the same manner as in Working Example 1 except that the second sublayer 14 was $Si_{0.45}C_{0.45}Al_{0.04}N_{0.06}$.

Working Example 3

In Working Example 3, a $Si_{(1-v-w-x)}C_wAl_xN_v$ substrate was manufactured basically in the same manner as in Working Example 1 except that the second sublayer 14 was $Si_{0.45}C_{0.45}Al_{0.06}N_{0.04}$.

Working Example 4

In Working Example 4, a $Si_{(1-v-w-x)}C_wAl_xN_v$ substrate was manufactured basically in the same manner as in Working Example 1 except that the third sublayer 15 was $Si_{0.05}C_{0.05}Al_{0.44}N_{0.46}$.

Working Example 5

In Working Example 5, a $Si_{(1-v-w-x)}C_wAl_xN_v$ substrate was manufactured basically in the same manner as in Working Example 1 except that the third sublayer 15 was $Si_{0.05}C_{0.05}Al_{0.46}N_{0.44}$.

Working Example 6

In Working Example 6, a $Si_{(1-v-w-x)}C_wAl_xN_v$ substrate was manufactured basically in the same manner as in Working Example 1 except that the Si substrate had a (111) main surface.

Working Example 7

In Working Example 7, a $Si_{(1-v-w-x)}C_wAl_xN_v$ substrate was manufactured basically in the same manner as in Working Example 6 except that the second sublayer 14 was $Si_{0.45}C_{0.45}Al_{0.04}N_{0.06}$.

Working Example 8

In Working Example 8, a $Si_{(1-v-w-x)}C_wAl_xN_v$ substrate was manufactured basically in the same manner as in Working Example 6 except that the second sublayer 14 was $Si_{0.45}C_{0.45}Al_{0.06}N_{0.04}$.

Working Example 9

In Working Example 9, a $Si_{(1-v-w-x)}C_wAl_xN_v$ substrate was manufactured basically in the same manner as in Working Example 6 except that the third sublayer 15 was $Si_{0.05}C_{0.05}Al_{0.44}N_{0.46}$.

Working Example 10

In Working Example 10, a $Si_{(1-v-w-x)}C_wAl_xN_v$ substrate was manufactured basically in the same manner as in Working Example 6 except that the third sublayer 15 was $S_{0.05}C_{0.05}Al_{0.46}N_{0.44}$.

Comparative Example 1

Comparative Example 1 was basically the same as Working Example 1 except that an AlN layer was grown on the Si substrate. In other words, the raw material 103 was an AlN raw material.

Comparative Example 2

Comparative Example 2 was basically the same as Working Example 6 except that an AlN layer was grown on the Si substrate. In other words, the raw material 103 was an AlN raw material.

Measurement Method

The $Si_{(1-v-w-x)}C_wAl_xN_v$ substrates according to Working Examples 1 to 10 and the AlN substrates according to Comparative Examples 1 and 2 were cooled to room temperature and were removed from the PLD apparatus 100. The number of cracks in a region 10 mm square of the main surface of each of the $Si_{(1-v-w-x)}C_wAl_xN_v$ layers according to Working Examples 1 to 10 and the AlN layers according to Comparative Examples 1 and 2 was then measured under an optical microscope. Cracks each having a total length of 1 mm or more in the longitudinal direction were counted, and cracks each having a total length below 1 mm were not counted. Table 1 shows the results.

TABLE 1

|  | Main surface of different type of substrate | Number of sublayers | Growth layer | | | Number of cracks |
|---|---|---|---|---|---|---|
|  |  |  | First sublayer | Second sublayer | Third sublayer |  |
| Working Example 1 | (001) | 3 | SiC | $Si_{0.45}C_{0.45}Al_{0.05}N_{0.05}$ | $Si_{0.05}C_{0.05}Al_{0.45}N_{0.45}$ | 5 |
| Working Example 2 | (001) | 3 | SiC | $Si_{0.45}C_{0.45}Al_{0.04}N_{0.06}$ | $Si_{0.05}C_{0.05}Al_{0.45}N_{0.45}$ | 5 |
| Working Example 3 | (001) | 3 | SiC | $Si_{0.45}C_{0.45}Al_{0.06}N_{0.04}$ | $Si_{0.05}C_{0.05}Al_{0.45}N_{0.45}$ | 5 |
| Working Example 4 | (001) | 3 | SiC | $Si_{0.45}C_{0.45}Al_{0.05}N_{0.05}$ | $Si_{0.05}C_{0.05}Al_{0.44}N_{0.46}$ | 5 |
| Working Example 5 | (001) | 3 | SiC | $Si_{0.45}C_{0.45}Al_{0.05}N_{0.05}$ | $Si_{0.05}C_{0.05}Al_{0.46}N_{0.44}$ | 5 |
| Working Example 6 | (111) | 3 | SiC | $Si_{0.45}C_{0.45}Al_{0.05}N_{0.05}$ | $Si_{0.05}C_{0.05}Al_{0.45}N_{0.45}$ | 5 |
| Working Example 7 | (111) | 3 | SiC | $Si_{0.45}C_{0.45}Al_{0.04}N_{0.06}$ | $Si_{0.05}C_{0.05}Al_{0.45}N_{0.45}$ | 5 |
| Working Example 8 | (111) | 3 | SiC | $Si_{0.45}C_{0.45}Al_{0.05}N_{0.04}$ | $Si_{0.05}C_{0.05}Al_{0.45}N_{0.45}$ | 5 |
| Working Example 9 | (111) | 3 | SiC | $Si_{0.45}C_{0.45}Al_{0.05}N_{0.05}$ | $Si_{0.05}C_{0.05}Al_{0.44}N_{0.46}$ | 5 |
| Working Example 10 | (111) | 3 | SiC | $Si_{0.45}C_{0.45}Al_{0.05}N_{0.05}$ | $Si_{0.05}C_{0.05}Al_{0.46}N_{0.44}$ | 5 |
| Comparative Example 1 | (001) | 1 | AlN | — | — | 10 |
| Comparative Example 2 | (111) | 1 | AlN | — | — | 10 |

Measurements

Table 1 shows that the number of cracks in each of the $Si_{(1-v-w-x)}C_wAl_xN_v$ layers according to Working Examples 1 to 10 was five. Each of the $Si_{(1-v-w-x)}C_wAl_xN_v$ layers according to Working Examples 1 to 10 was grown such that the composition of the $Si_{(1-v-w-x)}C_wAl_xN_v$ layer from the interface between the $Si_{(1-v-w-x)}C_wAl_xN_v$ layer and the different type of substrate 11 to the main surface 12a gradually deviated from the composition of the material of the different type of substrate 11. In contrast, the number of cracks in each of the AlN layers according to Comparative Examples 1 and 2 was ten. Working Examples 1 to 10, in which the component ratio x+v was monotonically increased from the different type of substrate to the $Si_{0.05}C_{0.05}(AlN)_{0.9}$ layer at the main surface of the $Si_{(1-v-w-x)}C_wAl_xN_v$ layer, reduced the difference in thermal expansion coefficient between the $Si_{(1-v-w-x)}C_wAl_xN_v$ layer and the different type of substrate and thereby reduced the number of cracks.

Both the $Si_{0.05}C_{0.05}(AlN)_{0.9}$ layers according to Working Examples 1 to 10 and the AlN layers according to Comparative Examples 1 and 2 have high AlN molar ratios (component ratios x+v). Thus, even if a $Si_{0.05}C_{0.05}(AlN)_{0.9}$ layer is grown instead of the AlN layer in Comparative Examples 1 and 2, the number of cracks is probably approximately nine and cannot be comparable to the number of cracks in the $Si_{0.05}C_{0.05}(AlN)_{0.9}$ layer according to Working Examples 1 to 10.

Thus, the present example showed that the crystallinity of the $Si_{(1-v-w-x)}C_wAl_xN_v$ layer can be improved by growing the $Si_{(1-v-w-x)}C_wAl_xN_v$ layer such that the component ratio x+v increases or decreases monotonically from the interface between the $Si_{(1-v-w-x)}C_wAl_xN_v$ layer and the different type of substrate to the main surface of the $Si_{(1-v-w-x)}C_wAl_xN_v$ layer.

Although the embodiments and examples of the present invention have been described, combinations of features of the embodiments and examples were also originally envisaged. It is to be understood that the embodiments and examples disclosed herein are illustrated by way of example and not by way of limitation in all respects. The scope of the present invention is defined by the appended claims rather than by the embodiments described above. All changes that fall within the scope of the claims and the equivalence thereof are therefore intended to be embraced by the claims.

| Reference Signs List | |
|---|---|
| 10a, 10b, 10c, 10d | $Si_{(1-v-w-x)}C_wAl_xN_v$ substrate |
| 11 | Different type of substrate |
| 11a, 12a | Main surface |
| 12 | $Si_{(1-v-w-x)}C_wAl_xN_v$ layer |
| 12b | Back surface |
| 13 | First layer |
| 14 | Second layer |
| 15 | Third layer |
| 16 | Fourth layer |
| 17 | Fifth sublayer |
| 18 | Sixth layer |
| 20 | Epitaxial wafer |
| 21 | $Al_{(1-y-z)}Ga_yIn_zN$ layer |
| 100 | PLD apparatus |
| 101 | Vacuum chamber |
| 102 | Laser source |
| 103 | Raw material |
| 104 | Stage |
| 105 | Pulse motor |
| 106 | Substrate holder |
| 107 | Controller |
| 109 | Gas-supply unit |

The invention claimed is:

1. A method for manufacturing a $Si_{(1-v-w-x)}C_wAl_xN_v$ substrate, comprising the steps of:
    preparing a different type of substrate; and
    growing a $Si_{(1-v-w-x)}C_wAl_xN_v$ layer having a main surface ($0 \leq v \leq 1$, $0 \leq w \leq 1$, $0 \leq x \leq 1$, and $0 \leq v+w+x \leq 1$) on the different type of substrate,
    wherein the component ratio x+v at the main surface of the $Si_{(1-v-w-x)}C_wAl_xN_v$ layer is $0 < x+v < 1$,
    the component ratio x+v increases or decreases monotonically from the interface between the $Si_{(1-v-w-x)}C_wAl_xN_v$ layer and the different type of substrate to the main surface, and
    the component ratio x+v at the interface between the $Si_{(1-v-w-x)}C_wAl_xN_v$ layer and the different type of substrate is closer to that of the material of the different type of substrate than the component ratio x+v at the main surface.

2. The method for manufacturing a $Si_{(1-v-w-x)}C_wAl_xN_v$ substrate according to claim 1, further comprising the step of removing the different type of substrate after the growing step.

3. The method for manufacturing a $Si_{(1-v-w-x)}C_wAl_xN_v$ substrate according to claim 1, wherein the $Si_{(1-v-w-x)}C_wAl_xN_v$ layer having a plurality of sublayers is grown in the growing step.

4. The method for manufacturing a $Si_{(1-v-w-x)}C_wAl_xN_v$ substrate according to claim 1, wherein the $Si_{(1-v-w-x)}C_wAl_xN_v$ layer is grown by a pulsed laser deposition method in the growing step.

5. A method for manufacturing an epitaxial wafer, comprising the steps of:
    manufacturing a $Si_{(1-v-w-x)}C_wAl_xN_v$ substrate by a method for manufacturing a $Si_{(1-v-w-x)}C_wAl_xN_v$ substrate according to claim 1; and
    growing an $Al_{(1-y-z)}Ga_yIn_zN$ layer ($0 \leq y \leq 1$, $0 \leq z \leq 1$, and $0 \leq y+z \leq 1$) on the $Si_{(1-v-w-x)}C_wAl_xN_v$ layer.

6. A $Si_{(1-v-w-x)}C_wAl_xN_v$ substrate comprising:
    a $Si_{(1-v-w-x)}C_wAl_xN_v$ layer ($0 \leq v \leq 1$, $0 \leq w \leq 1$, $0 \leq x \leq 1$, and $0 \leq v+w+x \leq 1$) having a main surface and a back surface opposite to the main surface,
    wherein the component ratio x+v at the main surface of the $Si_{(1-v-w-x)}C_wAl_xN_v$ layer is $0 < x+v < 1$, and
    the x+v increases or decreases monotonically from the back surface to the main surface of the $Si_{(1-v-w-x)}C_wAl_xN_v$ layer.

7. The $Si_{(1-v-w-x)}C_wAl_xN_v$ substrate according to claim 6, further comprising:
    a different type of substrate having a main surface,
    wherein the back surface of the $Si_{(1-v-w-x)}C_wAl_xN_v$ layer is in contact with the main surface of the different type of substrate, and
    the component ratio x+v at the back surface is closer to that of the material of the different type of substrate than the component ratio x+v at the main surface of the $Si_{(1-v-w-x)}C_wAl_xN_v$ layer.

8. The $Si_{(1-v-w-x)}C_wAl_xN_v$ substrate according to claim 6, wherein the $Si_{(1-v-w-x)}C_wAl_xN_v$ layer comprises a plurality of sublayers.

9. An epitaxial wafer comprising:
    a $Si_{(1-v-w-x)}C_wAl_xN_v$ substrate according to claim 6; and
    an $Al_{(1-y-z)}Ga_yIn_zN$ layer ($0 \leq y \leq 1$, $0 \leq z \leq 1$, and $0 \leq y+z \leq 1$) formed on the main surface of the $Si_{(1-v-w-x)}C_wAl_xN_v$ layer.

\* \* \* \* \*

UNITED STATES PATENT AND TRADEMARK OFFICE
CERTIFICATE OF CORRECTION

PATENT NO. : 8,715,414 B2  
APPLICATION NO. : 12/989036  
DATED : May 6, 2014  
INVENTOR(S) : Issei Satoh et al.

It is certified that error appears in the above-identified patent and that said Letters Patent is hereby corrected as shown below:

On the Title Page and in the Specification Col. 1 the title should read
PROCESS FOR PRODUCING ~~$Si_{(1-v-w-x)}C_wAl_xN_v$~~ $\underline{Si_{(1-v-w-x)}C_wAl_xN_v}$ BASE MATERIAL, PROCESS FOR PRODUCING EPITAXIAL WAFER, ~~$Si_{(1-v-w-x)}C_wAl_xN_v$~~ $\underline{Si_{(1-v-w-x)}C_wAl_xN_v}$ BASE MATERIAL, AND EPITAXIAL WAFER In the Claims At column 18, lines 32-38, regarding dependent Claim 5:

5. A method for manufacturing an epitaxial wafer, comprising the steps of:
manufacturing a $Si_{(1-v-w-x)}C_wAl_xN_v$ substrate by a method for manufacturing a $Si_{(1-v-w-x)}C_wAl_xN_v$ substrate according to claim 1; and
growing an $\underline{Al_{(1-y-z)}Ga_yIn_zN}$ ~~$Al_{(1-y-z)}Ga_yIn_zN$~~ layer (0≤y≤1, 0≤z≤1, and 0≤y+z≤1) on the $Si_{(1-v-w-x)}C_wAl_xN_v$ layer.

Signed and Sealed this
Twelfth Day of August, 2014

Michelle K. Lee
*Deputy Director of the United States Patent and Trademark Office*